United States Patent [19]
Komobuchi et al.

[11] Patent Number: 6,122,008
[45] Date of Patent: Sep. 19, 2000

[54] SOLID STATE IMAGE PICKUP DEVICE AND ITS DRIVING METHOD USING TWO DIFFERENT PERIODS IN A FIELD OR FRAME

[75] Inventors: Hiroyoshi Komobuchi, Kyoto; Yuuji Matsuda, Takatsuki, both of Japan

[73] Assignee: Matsushita Electric Industrial Co., Ltd., Osaka, Japan

[21] Appl. No.: 08/935,623

[22] Filed: Sep. 23, 1997

Related U.S. Application Data

[63] Continuation of application No. 08/726,337, Oct. 3, 1996, abandoned, which is a continuation of application No. 08/261,841, Jun. 17, 1994, abandoned.

[30] Foreign Application Priority Data

Jun. 17, 1993 [JP] Japan ................................. 5-145887

[51] Int. Cl.[7] ............................................ H04N 3/14
[52] U.S. Cl. ..................... 348/312; 348/323; 348/298
[58] Field of Search .................................. 348/311, 312, 348/315, 322, 323, 324, 296, 297, 298; 257/232

[56] References Cited

U.S. PATENT DOCUMENTS

| | | | |
|---|---|---|---|
| 4,528,596 | 7/1985 | Cope ........................................ | 348/241 |
| 4,862,487 | 8/1989 | Ando et al. ............................ | 348/296 X |
| 4,974,093 | 11/1990 | Murayama et al. .................... | 348/308 |
| 5,083,209 | 1/1992 | Inoue et al. ............................ | 348/296 |
| 5,182,648 | 1/1993 | Hirota .................................... | 348/311 |
| 5,216,512 | 6/1993 | Bruijns et al. ......................... | 348/335 |
| 5,229,857 | 7/1993 | Taniji ..................................... | 348/305 |
| 5,387,935 | 2/1995 | Kobayashi ............................. | 348/323 |
| 5,438,365 | 8/1995 | Yamashita et al. ..................... | 348/312 |
| 5,463,421 | 10/1995 | Deguchi et al. ....................... | 348/322 |

FOREIGN PATENT DOCUMENTS

| | | |
|---|---|---|
| 0 241 800 | 10/1987 | European Pat. Off. . |
| 0 487 332 | 5/1992 | European Pat. Off. . |
| 62-208668 | 9/1987 | Japan . |
| 63-250980 | 10/1988 | Japan ............................ H04N 5/335 |
| 1314066 | 12/1989 | Japan . |
| 3104386 | 5/1991 | Japan . |
| 3117281 | 5/1991 | Japan ............................ H04N 5/335 |
| 3153176 | 7/1991 | Japan . |

OTHER PUBLICATIONS

European Search Report dated Mar. 1, 1995.

*Primary Examiner*—Wendy Garber
*Assistant Examiner*—Andrew B. Christensen
*Attorney, Agent, or Firm*—Ratner & Prestia

[57] ABSTRACT

A method and apparatus for driving a solid state image pickup device. The method and apparatus include setting a first signal charging period and a second signal charging period during one frame or field of a video signal for each one of a plurality of unit pixels. The second signal charging period is shorter than the first signal charging period. A first signal charge is produced during the first signal charging period and a second signal charge is produced during the second signal charging period. It is judged whether the first signal charge is saturated or not saturated. Then based on this judgement an input light amount is determined. The input light amount is determined using only the second signal charge when the first signal charge is saturated. The input light amount is determined using only the first signal charge when the first signal charge is not saturated.

12 Claims, 10 Drawing Sheets

SOLID STATE IMAGE PICKUP DEVICE AND ITS DRIVING METHOD USING TWO DIFFERENT PERIODS IN A FIELD OR FRAME

This application is a continuation of application Ser. No. 08/726,337 filed Oct. 3, 1996 abandoned, which is a continuation of Ser. No. 08/261,841 filed Jun. 17, 1994, now abandoned.

BACKGROUND OF THE INVENTION

1. Field of the Invention

The present invention relates to a solid state image pickup device for expanding the management range in the quantity of incident light in the high-luminance side and a method for driving the same, and in particular, to a solid state image pickup device for expanding the management range of the quantity of incident light for elevated luminances by setting up at least two signal charging periods in the specified period represented by the field or frame of a video signal and reproducing the signal charges in the signal charging period without using any external field memory or any frame memory and a method for driving the same.

2. Related Art of the Invention

According to a conventional technique, at least two mutually-different charging periods are set in one frame or one field in the expanding the management range in quantity of incident light. For example, a first charging period T1 corresponding to the conventional vertical scanning period and a second charging period T2 shorter than the first charging period in the vertical blanking period are set in one field period $T_F$. Then a signal charge Q1 obtained in the first charging period is reproduced with a gain of 1, and a signal charge Q2 obtained in the second charging period is reproduced with a gain (T1/T2). A result, when the signal charge Q1 reaches a saturation charge quantity, a management range in quantity of incident light being (T1/T2) times greater than the gain in the conventional case is achieved using the signal information of the signal charge Q2.

In the above-mentioned element drive method for expanding the management range in the quantity of incident light, there is a proposal for dispensing with any external frame memory (Japanese Patent Laid-Open Publication No. SHO 63-250980). The above-mentioned proposal describes a method for continuously transferring signal charges obtained in two charging periods separately provided in one field period $T_F$ in a vertical CCD by producing three signal packets with four pixels and a total of eight transfer electrodes according to the structure of the current CCD, using signal charges of a mixture of two pixels in the first charging period as two packets, and using signal charges of a mixture of four pixels in the second charging period as one packet.

SUMMARY OF THE INVENTION

However, it is required to read two times during a time interval of Δ T for the purpose of additively mixing the signal charges of the mixture of four pixels. There exist two different types of signal charges T2 and (T2+Δ T) in an identical packet. When the signal charges of the mixture of four pixels in the two types of charging periods are mutually different in time by Δ T are subjected to calculation processing with the gain of (T1/T2) without distinction, there occurs disadvantages such as misalignment in color and misalignment in luminance when adjusting the second charging period T2 according to the quantity of light of the subject.

By using a drive method and solid state image pickup device free of the difference of Δ T between charging periods in the second charging period T2 that causes problems when signal charges are read from a photoelectric converting element to a vertical CCD at least two times in one field period, the management range in the quantity of incident light can be expanded. Therefore, misalignment in color and misalignment in luminance can be avoided.

The management range in quantity of incident light can be expanded to the high-luminance side without using any external field memory or any frame memory for a subject having a wide range of distribution in luminance by managing the quantity of light smaller than a standard quantity of light and the quantity of light about two times greater than the standard quantity of light with the first charging period T1 and managing a region having a saturation charge quantity in the first charging period T1 with the second charging period T2 in the vertical blanking period.

PREFERRED EMBODIMENTS

The following describes an embodiment of the present invention with reference to the drawings.

Figure 1:
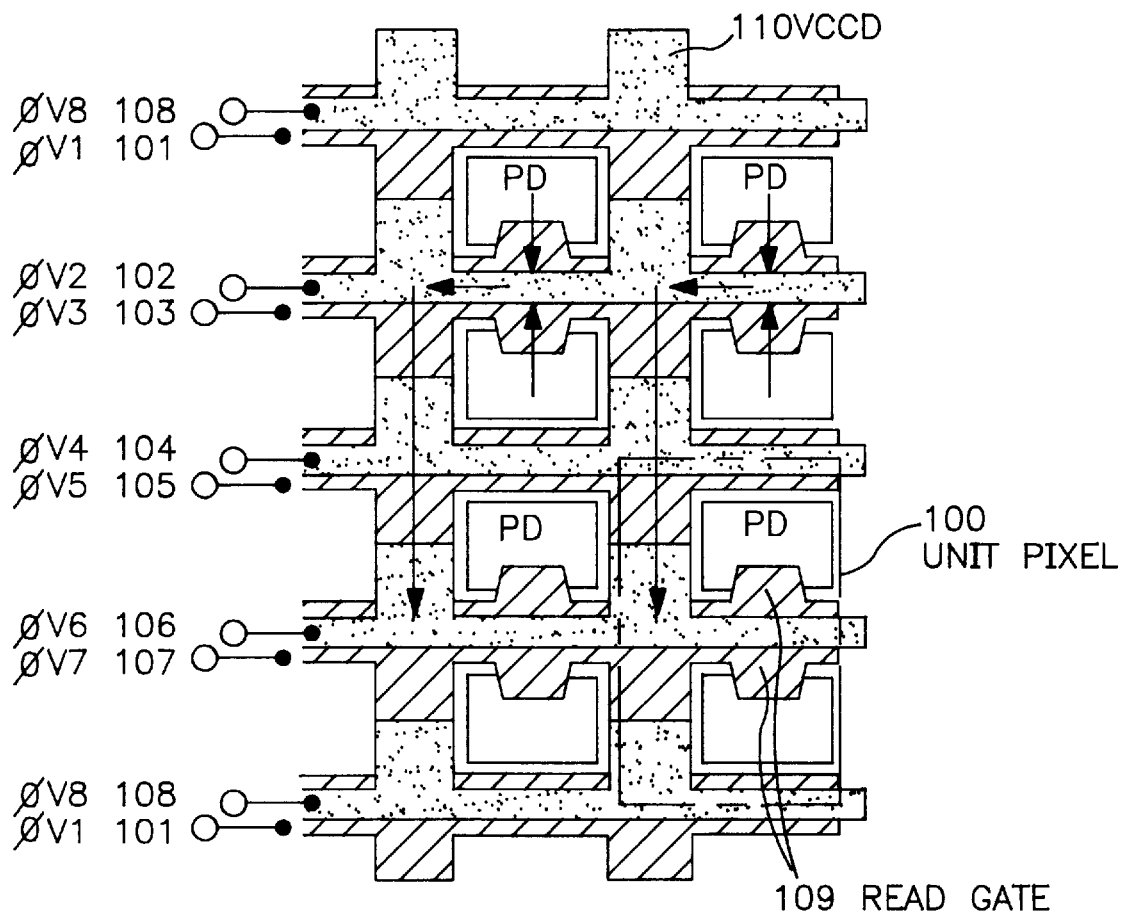
FIG. 1 is a diagram showing a solid state image pickup device of the present invention.

FIG. 1 shows an exemplified solid state image pickup device relevant to the claim 1 of the present invention.

Four transfer electrodes of a VCCD 110 correspond to a unit pixel 100, while eight transfer electrodes of φ V1 transfer electrode 101, φ V2 transfer electrode 102, φ V3 transfer electrode 103, φ V4 transfer electrode 104, φ V5 transfer electrode 105, φ V6 transfer electrode 106, φ V7 transfer electrode 107, and φ V8 transfer electrode 108 are used as a total of eight transfer electrodes to correspond to two continuous unit pixels, when an 8-phase transfer clock is applied to them. The φ V2 transfer electrode 102 and the V6 transfer electrode 106 are each provided with a read gate 109. Although two read gates are provided for one read electrode by means of a polysilicon of the first layer, the read electrode may utilize the polysilicon of either the first layer or the second layer. It is also permitted to consider that adjoining two pixels in the direction of the VCCD as one pixel in the case where the conventional CCD is used. For the element drive examples in FIG. 2 and subsequent figures, a description is provided based on the structure of FIG. 1.

Figure 2:
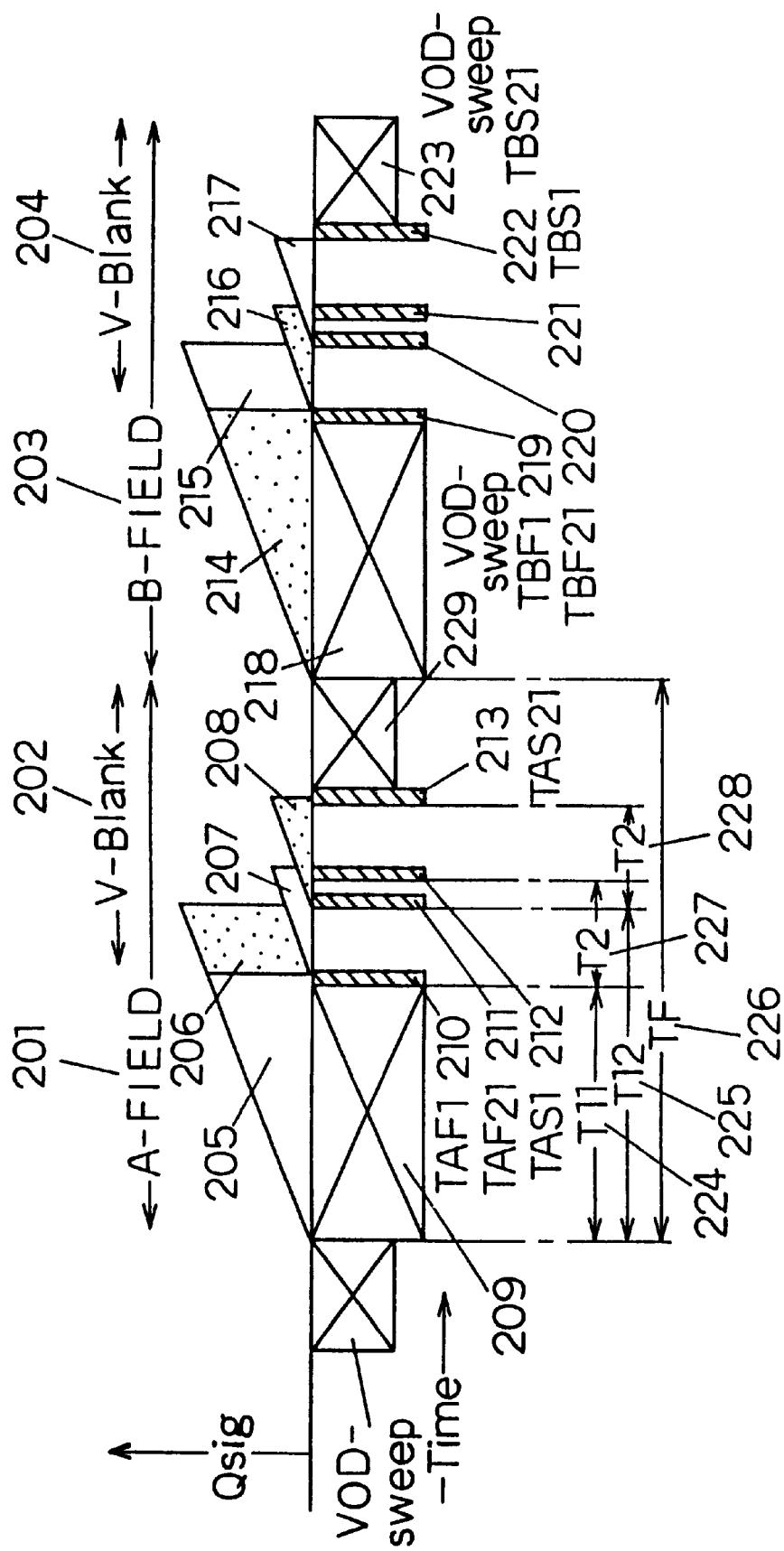
FIG. 2 is a chart for explaining a first drive method of the present invention.

FIG. 2 shows an A-FIELD 201 and a B-FIELD 203 of a normal TV frame. FIG. 2 also shows the timing of charge, read, and transfer of signals in the A-FIELD 201 and B-FIELD 203 in each odd-line pixel and each even-line pixel.

The odd-line pixel 232 and the even-line pixel 233 are preliminarily made to have charge period start timing which are caused to coincide using by a known electronic shuttering operation (VOD (vertical overflow drain shuttering operation) sweep).

The even-line pixel 233 obtains an even-line first signal charge 205 according to a signal input in a period T11 224. An operation of read to the VCCD is executed with timing $T_{AF1}$ 210. Meanwhile, the odd-line pixel 232 obtains an odd-line first signal charge 206 according to a signal input in a period T12 225, and an operation of read to the VCCD is executed with timing $T_{AF21}$ 211. Further in a V-blank period 202, the even-line pixel 233 obtains an even-line second signal charge 207 according to a signal input in a period T2 227. An operation of read to the VCCD is executed with timing $T_{AS1}$ 212. Meanwhile, the odd-line pixel 232 obtains an odd-line second signal charge 208 according to a signal input in a period T2 228 set up in an identical charging period with the period T2 227, and an operation of read to the VCCD is executed with timing $T_{AS21}$ 213. As a result, control of the charging times in the period T2 227 and the period T2 228 executed for the purpose of picking up a region having a high luminance of the subject in the V-blank period 202 is executed by adjusting a VOD-sweep period 229 provided within the entire field period 226.

Although the same operation is executed in the B-FIELD 203, it is permitted to replace the charging period of an odd-line first signal charge 214 with the charging period of an even-line first signal charge 215.

Figure 3:
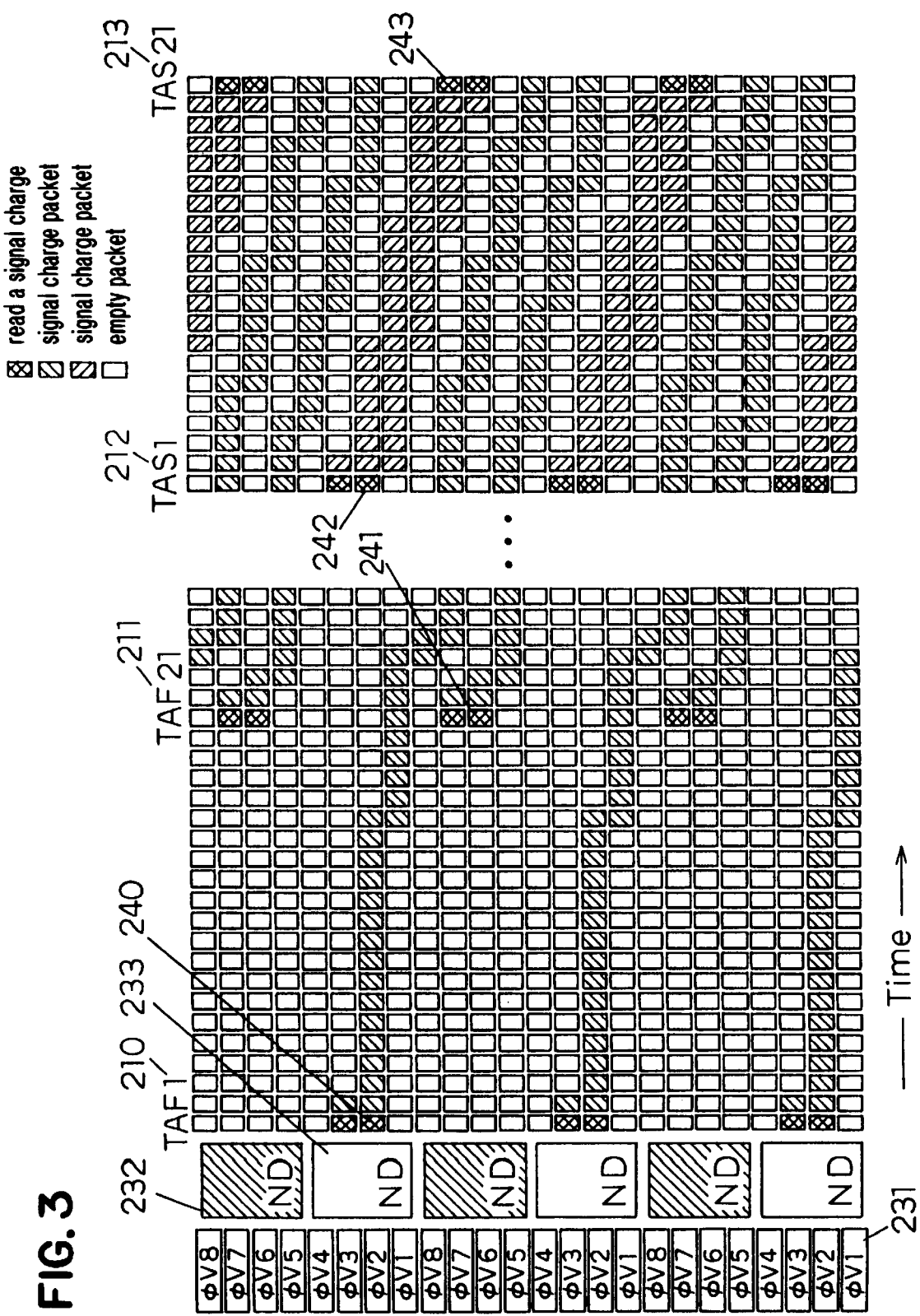
FIG. 3 is a diagram showing an A-field of a first drive embodiment of the present invention.
Figure 4:
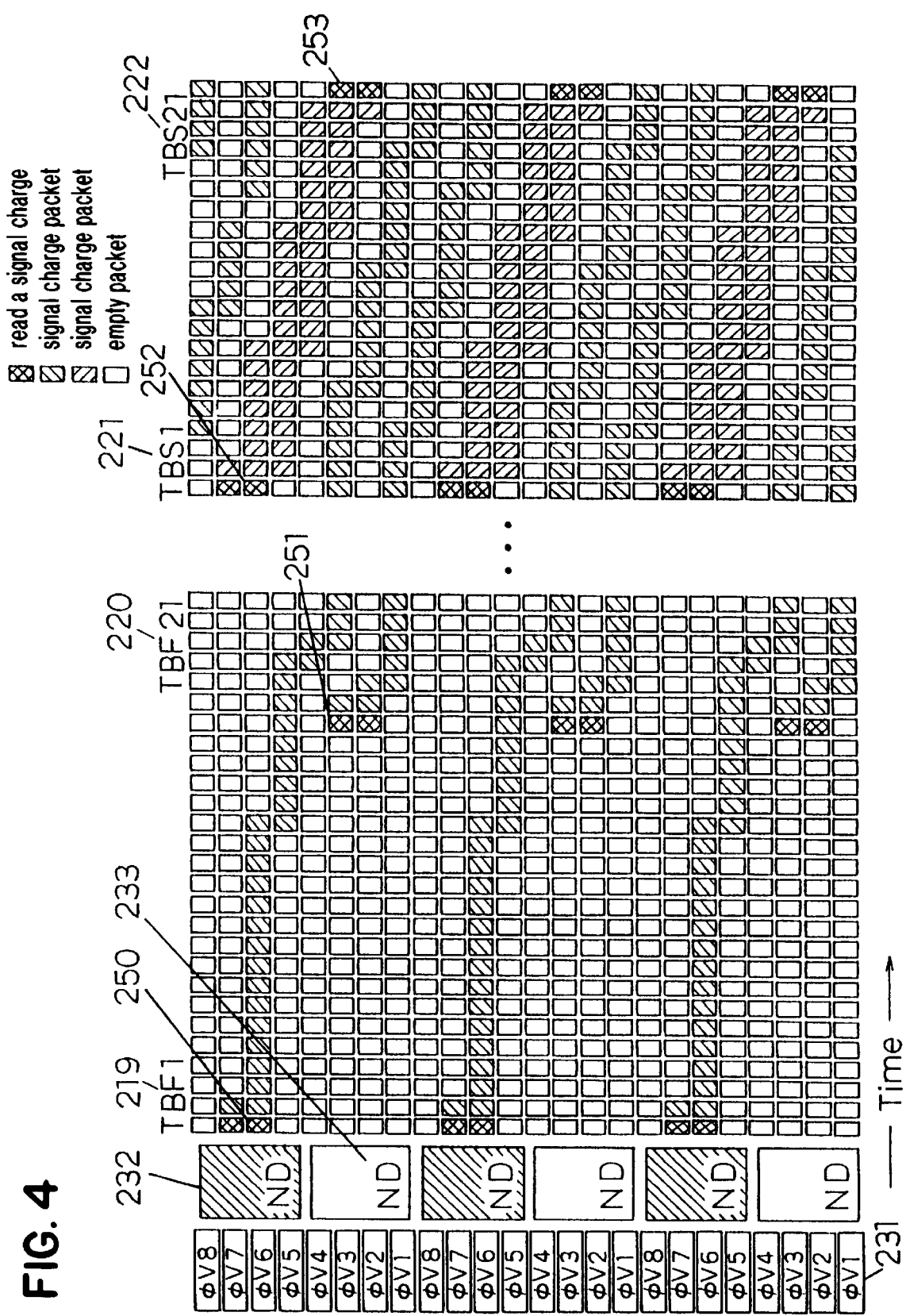
FIG. 4 is a diagram showing a B-field of the first drive embodiment of the present invention.

FIGS. 3 and 4 show the timing of the read and transfer operations. A signal charge 240 read with the timing $T_{AF1}$ 210 is transferred in the VCCD by one pixel. With the timing $T_{AF21}$ 211, a signal charge 241 is read. In FIG. 3, twenty clock pulses are used from the timing $T_{AF1}$ 210 to the timing $T_{AF21}$ 211. Subsequently, by using twenty clock pulses from the timing $T_{AS1}$ 212 to the timing $T_{AS21}$ 213, the charging periods of T2 227 and T2 228 are allowed to have the same duration. Further, a signal charge 242 corresponding to the even-line second signal charge 207 and a signal charge 243 corresponding to the odd-line second signal charge 208 are mixed with each other with the timing $T_{AS21}$ 213 in a manner as shown in FIG. 3. There is an interval of twenty clock pulses from $T_{AS1}$ 212 to $T_{AS21}$ 213 between the periods for reading both the signal charges. Subsequently, the signal charges are transferred in the VCCD according to the 8-phase clock. Although the charging periods T2 227 and T2 228 have a charging period of twenty clock pulses in this example, it is of course permitted to provide no limitation on the number of clock pulses. Meanwhile, as described hereinbefore, the charging periods of T2 227 and T2 228 are controlled by increasing or decreasing the interval from $T_{AF21}$ 211 to $T_{AS1}$ 212, according to which the VOD-sweep period 229 is increased or decreased.

Figure 5:
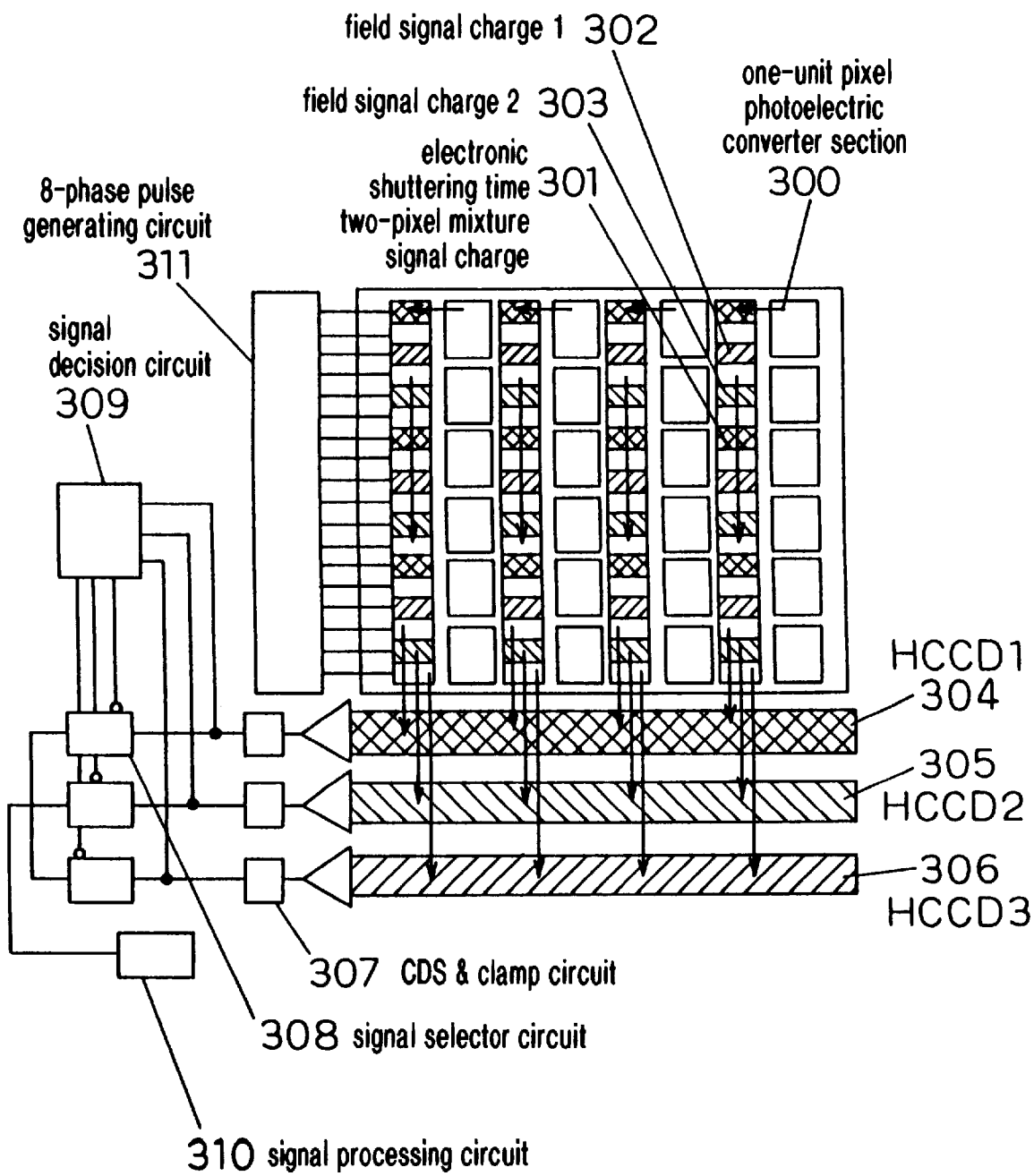
FIG. 5 is a diagram of an exemplified first solid state image pickup device of the present invention.
Figure 6:
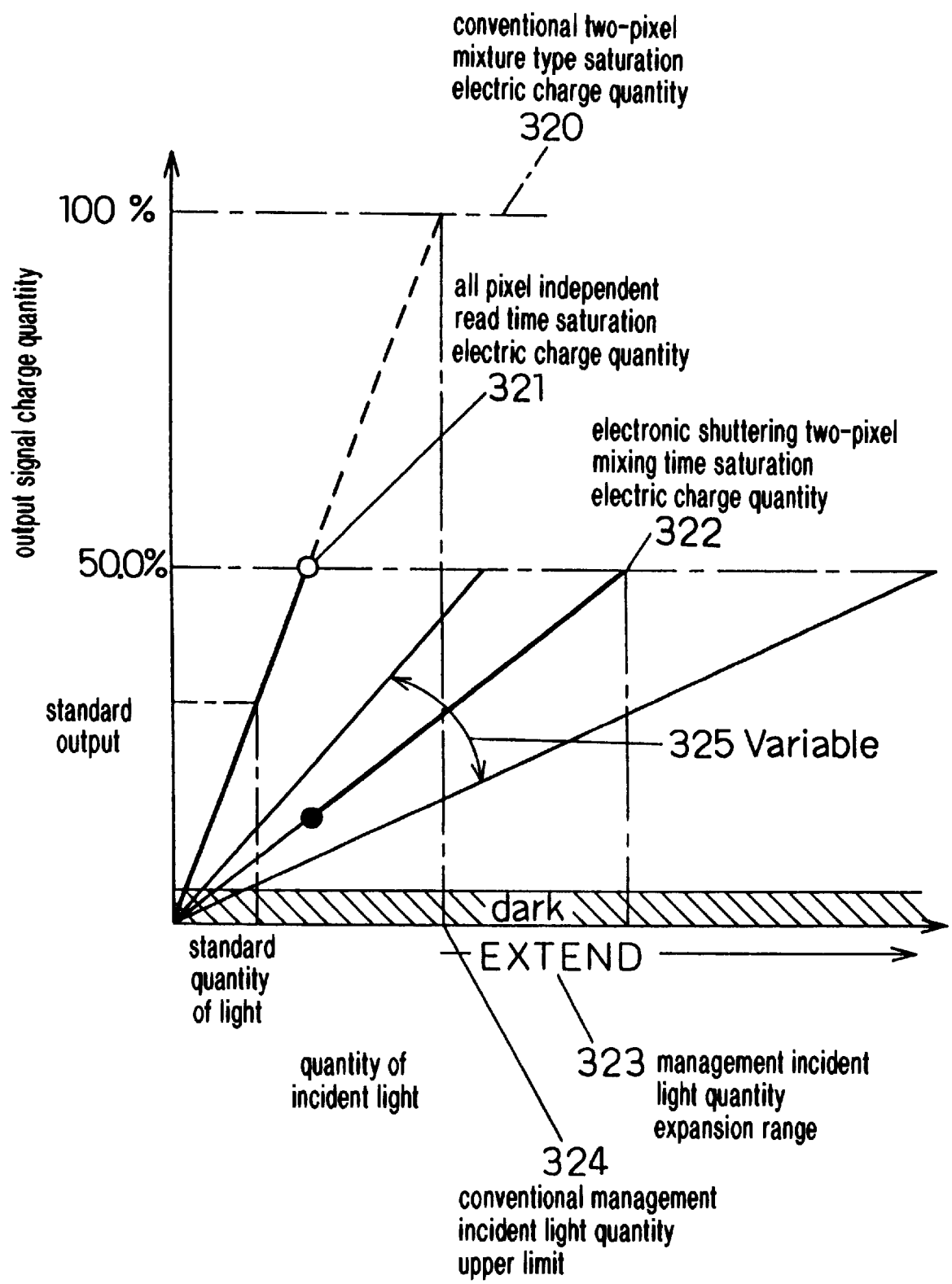
FIG. 6 is a graph for explaining the effect of the first embodiment of the present invention.

FIG. 5 shows an embodiment relevant to the claims 5, 6, and 8. FIG. 6 shows the effect of expanding the management range in quantity of incident light.

Incident light is photo-electrically converted in a one-unit pixel photoelectric converter section 300. Meanwhile, an electronic shuttering time two-pixel mixture signal charge 301, a field signal charge 1 302, and a field signal charge 2 303 are transferred respectively by HCCD1 304, HCCD2 305, and HCCD3 306. After passing through a CDS & clamp circuit 307, they are subjected to decision of signal saturation by a signal decision circuit 309 based on the saturation or unsaturation condition of signals output from all or a part of the HCCD1, 2, and 3. After being further subjected to selection of output in a signal selector circuit 308, they are subjected to calculation processing as described hereinafter in a signal processing circuit 310 to execute image signal reproduction.

An exemplified image reproducing method is shown. In the following conditional expressions, $V_T$ represents a voltage corresponding to the saturation charge quantity of an element.

First, when the condition of Equation 1 is true in regard to the signal voltages V (T1) and V (T12) in the charging periods T11 and T12, the signals V (T11) and V (T12) are selected by the signal selector circuit 308. When the condition of Equation 1 is false, the signal selector circuit 308 selects the electronic shuttering time two-pixel mixture signal charge 301, while the signal voltage in the charging period T2 is converted into Vsig (T2) in a signal processing circuit 310 through calculation of Equation 2. Although a is defined by Equation 3 in this place, it is permitted to use another appropriate value, for example, the values in Equation 4. It should be noted that the other signals which have not been selected are abandoned.

Equation 1:

$$max\ (V\ (T11),\ V\ (T12)) < V_T$$

Equation 2:

$$Vsig\ (T2) = a \times V\ (T2)$$

Equation 3:

$$a = T11/T2$$

Equation 4:

$$a = T12/T2$$

The expansion of the management range in quantity of incident light of the present embodiment will be described with reference to FIG. 6.

An output signal charge quantity obtained by the read and transfer operations through mixture of two pixels in a conventional CCD is shown as a conventional two-pixel mixture type saturation electric charge quantity 302. The saturation charge quantity of signal charges in the charging periods T11 224 and T12 225 shown in FIG. 2 (a) come to have a value corresponding to one transfer electrode in one unit pixel in one unit pixel 100 shown in FIG. 1, and therefore the value is one fourth of the conventional two-pixel mixture type saturation electric charge quantity. In forming a luminance signal, a signal charge 240 and a signal charge 241 are added together in an external circuit, and therefore the value is half of the conventional two-pixel mixture type saturation charge quantity. The value is shown as all pixel independent read time saturation electric charge quantity 321.

According to the element and drive method of the present embodiment, a signal charge obtained by mixing the even-line second signal charge 207 in the charging period T2 227 with the odd-line second signal charge 208 in the charging period T2 228 can be independently read simultaneously, and therefore an electronic shuttering two-pixel mixing time saturation electric charge quantity 322 can be obtained. In this place, the periods T2 227 and T2 228 can be varied, for example, from 1/500 of a second to 1/2000 of a second to allow an effect as represented by variable 325 in FIG. 6 to be obtained. Therefore, a management incident light quantity expansion range 323 greater than a conventional management incident light quantity upper limit 324 can be achieved.

Figure 7:
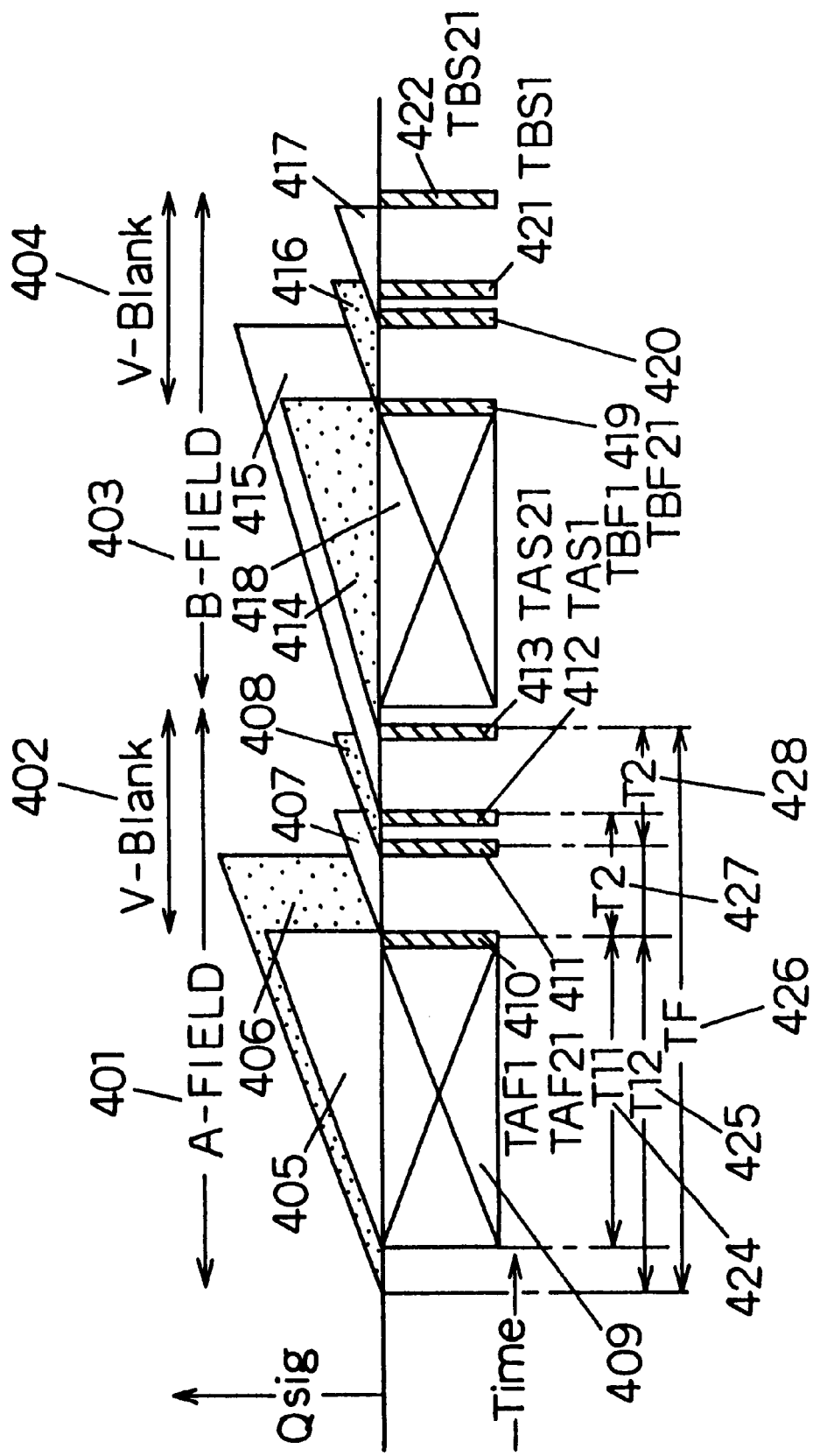
FIG. 7 is a chart for explaining a second drive method of the present invention.
Figure 8:
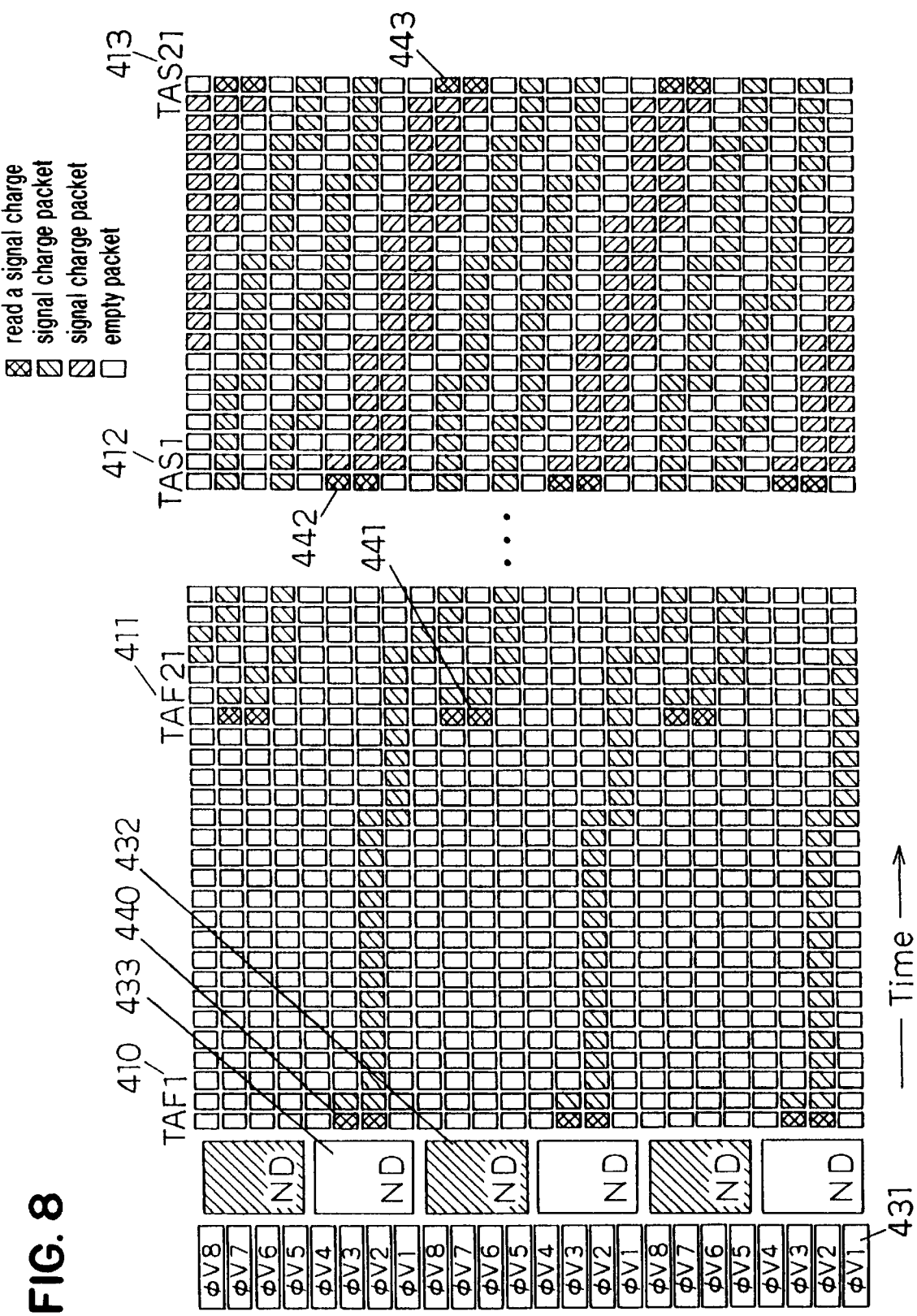
FIG. 8 is a diagram of an A-field of a second drive embodiment of the present invention.
Figure 9:
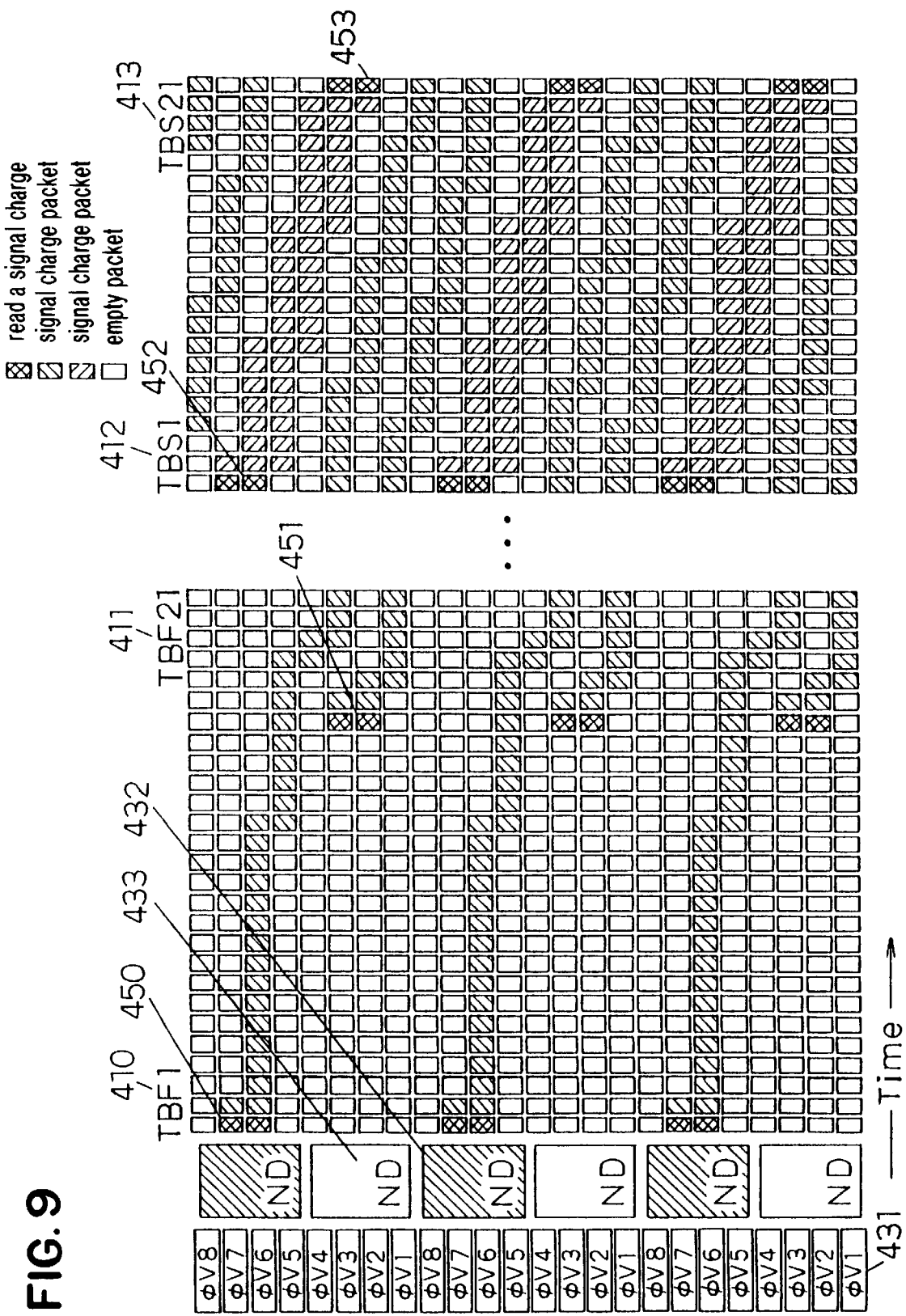
FIG. 9 is a diagram of a B-field of the second drive embodiment of the present invention.

FIGS. 7, 8, and 9 show an embodiment in the case where VOD-sweep is not used. FIG. 7 shows an odd-line pixel 432 and an even-line pixel 433 as well as the timing of signal charge, read, and transfer in an A-FIELD 401 and a B-FIELD 403 of a normal TV frame.

In this case, the charging period start timings of the odd-line pixel 432 and the even-line pixel 433 differ from each other. The even-line pixel 433 obtains an even-line first signal charge 405 according to a signal input in a period T11 424. An operation of read to the VCCD is executed with timing $T_{AF1}$ 410. Meanwhile, the odd-line pixel 432 obtains an odd-line first signal charge 406 according to a signal input in a period T12 425, and an operation of read to the VCCD is executed with timing $T_{AF21}$ 411. Further in a V-blank period 402, the even-line pixel 433 obtains an even-line second signal charge 407 according to a signal input in a period T2 427. An operation of read to the VCCD is executed with timing $T_{AS1}$ 412. Meanwhile, the odd-line pixel 432 obtains an odd-line second signal charge 408 according to a signal input in a period T2 428 set in an identical charging period with the period T2 427, and an operation of read to the VCCD is executed with timing $T_{AS21}$ 413. In this place, the periods T11 424 and T12 425 differ from each other and also differ depending on whether they are in the A-FIELD 401 or in the B-FIELD 403. Therefore, when the periods T2 427 and T2 428 having the same charging time are controlled, there is a possibility of generating misalignment in color and misalignment in luminance in the period of four fields. However, the pixel data are read independently in the present invention, a calculation (Equation 6) which takes the ratio in charging period (Equation 5) into account can be allowed. Therefore, by using a value Vsig' (T11) calculated in terms of the charging period T12, neither misalignment in color nor misalignment in luminance takes place.

Equation 5:

$$b = T12/T11$$

Equation 6:

$$Vsig'(T11) = b \times V(T11)$$

FIGS. 8 and 9 show the timing of the read and transfer operations. A signal charge 440 read with the timing $T_{AF1}$ 410 is transferred in the VCCD by one pixel. With the timing $T_{AF21}$ 411, a signal charge 441 is read. In FIG. 3, twenty clock pulses are used from the timing $T_{AF1}$ 410 to the timing $T_{AF21}$ 411. Subsequently, by aligning the timing from $T_{AS1}$ 412 to the timing $T_{AS21}$ 413 in twenty clock pulses, the charging periods in the period T2 427 and T2 428 are allowed to have an identical duration. Further, after a signal charge 442 corresponding to the even-line second signal charge 407 is transferred by one pixel in the period of twenty clock pulses, a signal charge 443 corresponding to the odd-line second signal charge 408 is read through superimposition with the timing $T_{AS21}$ 412 in a manner as shown in FIG. 3 to be mixed with the signal charge and subsequently transferred in the VCCD according to the 8-phase clock. Although the charging periods T2 427 and T2 428 correspond to twenty clock pulses in this example, it is of course permitted to provide no limitation on the number of clock pulses.

Figure 10:
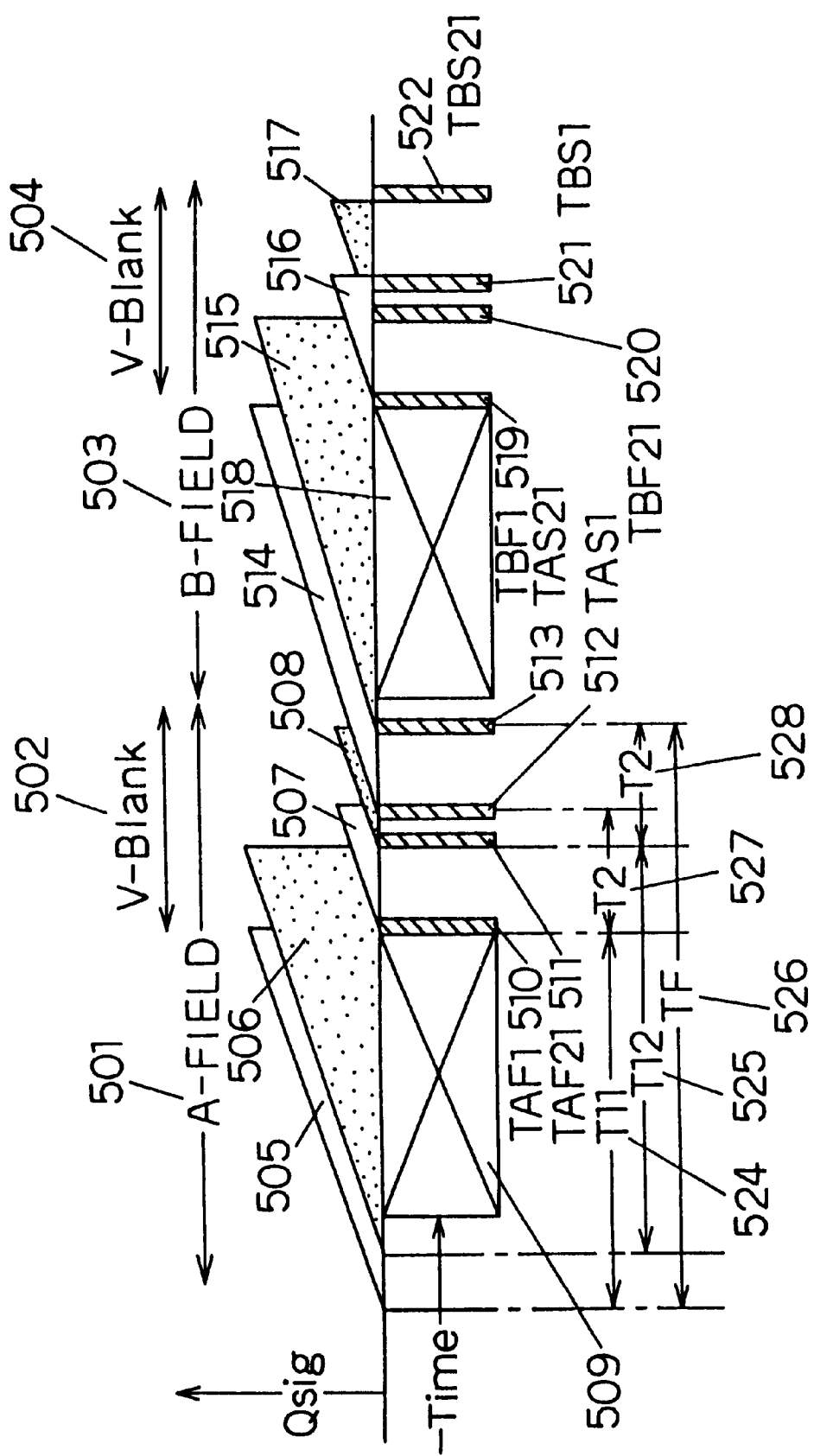
FIG. 10 is a chart for explaining a third drive method of the present invention.

FIG. 10 shows a case where the charging period of an odd-line first signal charge 414 and the charging period of an even-line first signal charge 415 as shown in FIG. 7 are replaced with each other. In this place, an even-line first signal charge 505 is a signal charge obtained from a signal input in a period T11 524. An operation of read to the VCCD is executed with timing $T_{AF1}$ 510. An odd-line first signal charge 506 is a signal charge obtained from a signal input in a period T12 525, and an operation of read to the VCCD is executed with timing $T_{AF2}$ 511. An even-line second signal charge 507 is a signal obtained from a signal input in a period T2 527. An operation of read to the VCCD is executed with timing $T_{AS1}$ 512. An odd-line second signal charge 508 is a signal obtained from a signal input in a period T2 528, and an operation of read to the VCCD is executed with timing $T_{AS2}$ 513.

In the present invention, the periods T11 524 and T12 525 can be set up at an identical duration, the conversion of Equation 6 is not necessary.

As described above, in the present invention, the management range in quantity of incident light can be expanded to the high-luminance side without using any field memory or any frame memory.

What is claimed is:

1. A method for driving a solid state image pickup device having a plurality of unit pixel means where each one of the plurality of unit pixel means corresponds to a pixel means having at least one input converting section, and CCD electric charge transfer means, the method comprising the steps of:

setting a first signal charging period and a second signal charging period during a field of a video signal for each one of the plurality of unit pixel means, where the second signal charging period is shorter than the first signal charging period;

setting, during the field, the second signal charging period of a first unit pixel means and the second signal charging period of a second unit pixel means so that the second signal charging periods for the first and second unit pixel means have different start times and similar time duration, the first and second unit pixel means are adjacent to each other in a vertical direction, each one of the first and second unit pixel means adjacent to each other in the vertical direction produce first signal charges during the second signal charging period; and mixing the first signal charges during a transfer operation using the CCD electric charge transfer means to produce a mixed signal charge.

2. The method for driving the solid state image pickup device according to claim 1, wherein each one of the first and second unit pixel means adjacent to each other in the vertical direction respectively produce a second signal charge and a third signal charge during the first signal charging period, and wherein the method further comprises:

(a) transferring the mixed signal charge to an external signal processing circuit using a first HCCD;

(b) transferring the second signal charge to the external signal processing circuit using a second HCCD; and (c) transferring the third signal charge to the external signal processing circuit using a third HCCD;

wherein steps (a), (b), and (c) are performed in the same horizontal scanning period.

3. The method for driving a solid state image pickup device according to claim 1, wherein each one of the first and second unit pixel means which are adjacent to each other in the vertical direction respectively produce a second signal charge and a third signal charge during the first signal charging period, and wherein the method further comprises the steps of:

(a) transferring the mixed signal charge to an external signal processing circuit using a first HCCD; and (b) transferring the second and third signal charges to the external signal processing circuit using a second HCCD;

wherein steps (a) and (b) are performed in the same horizontal scanning period.

4. A method for driving a solid state image pickup device having a plurality of unit pixel means where each one of the plurality of unit pixel means corresponds to a pixel means having at least one input converting section, and CCD electric charge transfer means, the method comprising the steps of:

setting a first signal charging period and a second signal charging period during a field of a video signal for each one of the plurality of unit pixel means, where the second signal charging period is shorter than the first signal charging period, the second signal charging period is controlled using an electronic shuttering operation within the field of the video signal;

setting, during the field, the second signal charging period of a first unit pixel means and the second signal charging period of a second unit pixel means so that the second signal charging periods for the first and second unit pixel means have different start times and similar time duration, the first and second unit pixel means are adjacent to each other in a vertical direction, each one of the first and second unit pixel means adjacent to each other in the vertical direction produce first signal charges during the second signal charging period; and mixing the first signal charges during a transfer operation using the CCD electric charge transfer means to produce a mixed signal charge.

5. The method for driving the solid state image pickup device according to claim 4, wherein each one of the first and second unit pixel means adjacent to each other in the vertical direction respectively produce a second signal charge and a third signal charge during the first signal charging period, and wherein the method further comprises:

(a) transferring the mixed signal charge to an external signal processing circuit using a first HCCD;

(b) transferring the second signal charge to the external signal processing circuit using a second HCCD; and (c) transferring the third signal charge to the external signal processing circuit using a third HCCD;

wherein steps (a), (b), and (c) are performed in the same horizontal scanning period.

6. The method for driving a solid state image pickup device according to claim 4 wherein each one of the first and second unit pixel means which are adjacent to each other in the vertical direction respectively produce a second signal charge and a third signal charge during the first signal charging period, and wherein the method further comprises the steps of:

(a) transferring the mixed signal charge to an external signal processing circuit using a first HCCD; and (b) transferring the second and third signal charges to the external signal processing circuit using a second HCCD;

wherein steps (a) and (b) are performed in the same horizontal scanning period.

7. A method for driving a solid state image pickup device having a plurality of unit pixel means where each one of the plurality of unit pixel means corresponds to a pixel means having at least one input converting section, and CCD electric charge transfer means, the method comprising the steps of:

setting a first signal charging period and a second signal charging period during one frame or field of a video signal for each one of the plurality of unit pixel means, where the second signal charging period is shorter than the first signal charging period;

setting, during the one frame or field, the second signal charging period of a first unit pixel means and the second signal charging period of a second unit pixel means so that the second signal charging periods for the first and second unit pixel means have different start times and similar time duration, the first and second unit pixel means are adjacent to each other in a vertical direction, each one of the first and second unit pixel means adjacent to each other in the vertical direction produce first signal charges during the second signal charging period; and mixing the first signal charges during a transfer operation using the CCD electric charge transfer means to produce a mixed signal charge.

8. The method for driving the solid state image pickup device according to claim 7, wherein each one of the first and second unit pixel means adjacent to each other in the vertical direction respectively produce a second signal charge and a third signal charge during the first signal charging period, and wherein the method further comprises:

(a) transferring the mixed signal charge to an external signal processing circuit using a first HCCD;

(b) transferring the second signal charge to the external signal processing circuit using a second HCCD; and (c) transferring the third signal charge to the external signal processing circuit using a third HCCD;

wherein steps (a), (b), and (c) are performed in the same horizontal scanning period.

9. The method for driving a solid state image pickup device according to claim 7, wherein each one of the first and second unit pixel means which are adjacent to each other in the vertical direction respectively produce a second signal charge and a third signal charge during the first signal charging period, and wherein the method further comprises the steps of:

(a) transferring the mixed signal charge to an external signal processing circuit using a first HCCD; and (b) transferring the second and third signal charges to the external signal processing circuit using a second HCCD;

wherein steps (a) and (b) are performed in the same horizontal scanning period.

10. A method for driving a solid state image pickup device having a plurality of unit pixel means where each one of the plurality of unit pixel means corresponds to a pixel means having at least one input converting section, and CCD electric charge transfer means, the s method comprising the steps of:

setting a first signal charging period and a second signal charging period during one frame or field of a video signal for each one of the plurality of unit pixel means, where the second signal charging period is shorter than the first signal charging period, the second signal charging period is controlled using an electronic shuttering operation within the one frame or field of the video signal;

setting, during the one frame or field, the second signal charging period of a first unit pixel means and the second signal charging period of a second unit pixel means so that the second signal charging periods for the first and second unit pixel means have different start times and similar time duration, the first and second unit pixel means are adjacent to each other in a vertical direction, each one of the first and second unit pixel means adjacent to each other in the vertical direction produce first signal charges during the second signal charging period; and mixing the first signal charges during a transfer operation using the CCD electric charge transfer means to produce a mixed signal charge.

11. The method for driving the solid state image pickup device according to claim 10, wherein each one of the first and second unit pixel means adjacent to each other in the vertical direction respectively produce a second signal charge and a third signal charge during the first signal charging period, and wherein the method further comprises:

(a) transferring the mixed signal charge to an external signal processing circuit using a first HCCD;

(b) transferring the second signal charge to the external signal processing circuit using a second HCCD; and (c) transferring the third signal charge to the external signal processing circuit using a third HCCD;

wherein steps (a), (b), and (c) are performed in the same horizontal scanning period.

12. The method for driving a solid state image pickup device according to claim 10, wherein each one of the first and second unit pixel means which are adjacent to each other in the vertical direction respectively produce a second signal charge and a third signal charge during the first signal charging period, and wherein the method further comprises the steps of:

(a) transferring the mixed signal charge to an external signal processing circuit using a first HCCD; and (b) transferring the second and third signal charges to the external signal processing circuit using a second HCCD;

wherein steps (a) and (b) are performed in the same horizontal scanning period.

* * * * *

UNITED STATES PATENT AND TRADEMARK OFFICE
CERTIFICATE OF CORRECTION

PATENT NO. : 6,122,008
DATED : September 19, 2000
INVENTOR(S) : Komobuchi et al.

It is certified that error appears in the above-identified patent and that said Letters Patent is hereby corrected as shown below:

<u>Column 8,</u>
Line 64, between "the" and "method" delete "s".

Signed and Sealed this

Sixth Day of November, 2001

*Attest:*

*Attesting Officer*

NICHOLAS P. GODICI
*Acting Director of the United States Patent and Trademark Office*